US008453714B2

(12) United States Patent
Li et al.

(10) Patent No.: US 8,453,714 B2
(45) Date of Patent: Jun. 4, 2013

(54) HEAT DISSIPATION DEVICE WITH HEAT PIPE

(75) Inventors: Wei Li, Shenzhen (CN); Yi-Qiang Wu, Shenzhen (CN); Chun-Chi Chen, Taipei Hsien (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 474 days.

(21) Appl. No.: 12/902,170

(22) Filed: Oct. 12, 2010

(65) Prior Publication Data

US 2011/0155351 A1    Jun. 30, 2011

(30) Foreign Application Priority Data

Dec. 30, 2009   (CN) .......................... 2009 1 0312579

(51) Int. Cl.
*F28F 7/00* (2006.01)
*F28D 15/00* (2006.01)

(52) U.S. Cl.
USPC ................ 165/80.2; 165/104.26; 165/104.19; 228/183; 228/214; 228/215; 361/679.47; 361/679.52; 361/679.54; 361/697; 361/700; 361/703; 361/704; 361/707; 361/709; 361/710; 361/711

(58) Field of Classification Search
USPC ............. 165/80.2, 104.26, 104.19, 76, 134.1, 165/182, 151; 228/183, 214, 215; 361/679.47, 361/679.52, 679.54, 697, 700, 703, 704, 361/707, 709, 710, 711

See application file for complete search history.

(56) References Cited

U.S. PATENT DOCUMENTS

| 5,309,982 | A | * | 5/1994 | Aliano ............................ 165/76 |
| 5,511,609 | A | * | 4/1996 | Tyler ........................... 165/134.1 |
| 6,612,366 | B1 | * | 9/2003 | Chuang ....................... 165/134.1 |
| 7,500,513 | B2 | * | 3/2009 | Zhang et al. ..................... 165/76 |
| 2006/0201657 | A1 | * | 9/2006 | Li ............................ 165/104.33 |
| 2007/0163767 | A1 | * | 7/2007 | Mitchell et al. ............... 165/182 |
| 2007/0284083 | A1 | * | 12/2007 | Sung ............................. 165/80.3 |
| 2008/0121370 | A1 | * | 5/2008 | Luo et al. ..................... 165/80.3 |
| 2010/0259897 | A1 | * | 10/2010 | Min et al. ...................... 361/700 |

FOREIGN PATENT DOCUMENTS

CN        201062930 Y    5/2008

* cited by examiner

*Primary Examiner* — Allen J. Flanigan
*Assistant Examiner* — Claire Rojohn, III
(74) *Attorney, Agent, or Firm* — Altis Law Group, Inc.

(57) ABSTRACT

An exemplary heat dissipation device includes a fin assembly, a heat pipe, and a protective member. The fin assembly includes stacked fins and air passages between fins. Each fin includes a main body, an extending hole defined in the main body, and a flange extending from the main body around the extending hole. The heat pipe is received in the extending holes of the fins and abuts the flanges of the fins. The protective member includes a plurality pairs of elastic arms. Each pair of elastic arms is sandwiched between a free end of the flange of a corresponding fin and the main body of a corresponding adjacent fin to prevent solder associated with the heat pipe from flowing into the corresponding air passage.

20 Claims, 5 Drawing Sheets

HEAT DISSIPATION DEVICE WITH HEAT PIPE

BACKGROUND

1. Technical Field

The disclosure generally relates to heat dissipation devices, and particularly to a heat dissipation device with a heat pipe.

2. Description of Related Art

It is well known that heat is generated by electronic components, such as integrated circuit chips, during their operation. If the heat is not efficiently removed, the electronic components may suffer damage. Thus, heat dissipation devices are often used to cool the electronic components.

A frequently used heat dissipation device includes a fin assembly and a heat pipe attached thereto. The heat pipe includes a heat absorption portion, and a heat dissipation portion extending from the heat absorption portion. The heat absorption portion of the heat pipe contacts an electronic component, absorbing heat therefrom. The heat dissipation portion of the heat pipe extends through and contacts the fin assembly, transferring heat generated by the electronic component to the fin assembly and thence to the exterior. Thus, the electronic component is kept within a normal operating temperature.

The fin assembly includes multiple spaced, parallel fins. A multiplicity of air passages is defined between fins. Each of the fins defines a punched through hole allowing extension of the heat pipe therethrough. When the through hole is formed by a punch, a flange is formed around the through hole to fix to the heat pipe with solder. Generally, a height of the flange of each fin is substantially the same as a distance between two adjacent fins to prevent solder overflowing from the flange into the air passage between the adjacent fins.

However, the height of the flange is restricted by a diameter of the through hole. When the fins are to be sparsely distributed, the height of the flange is generally less than a distance between two adjacent fins. It is inevitable that solder overflows from the flange into the air passage between the adjacent fins, not only wasting solder but also affecting the aesthetic appearance of the heat dissipation device.

What is needed, therefore, is a heat dissipation device with a heat pipe which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
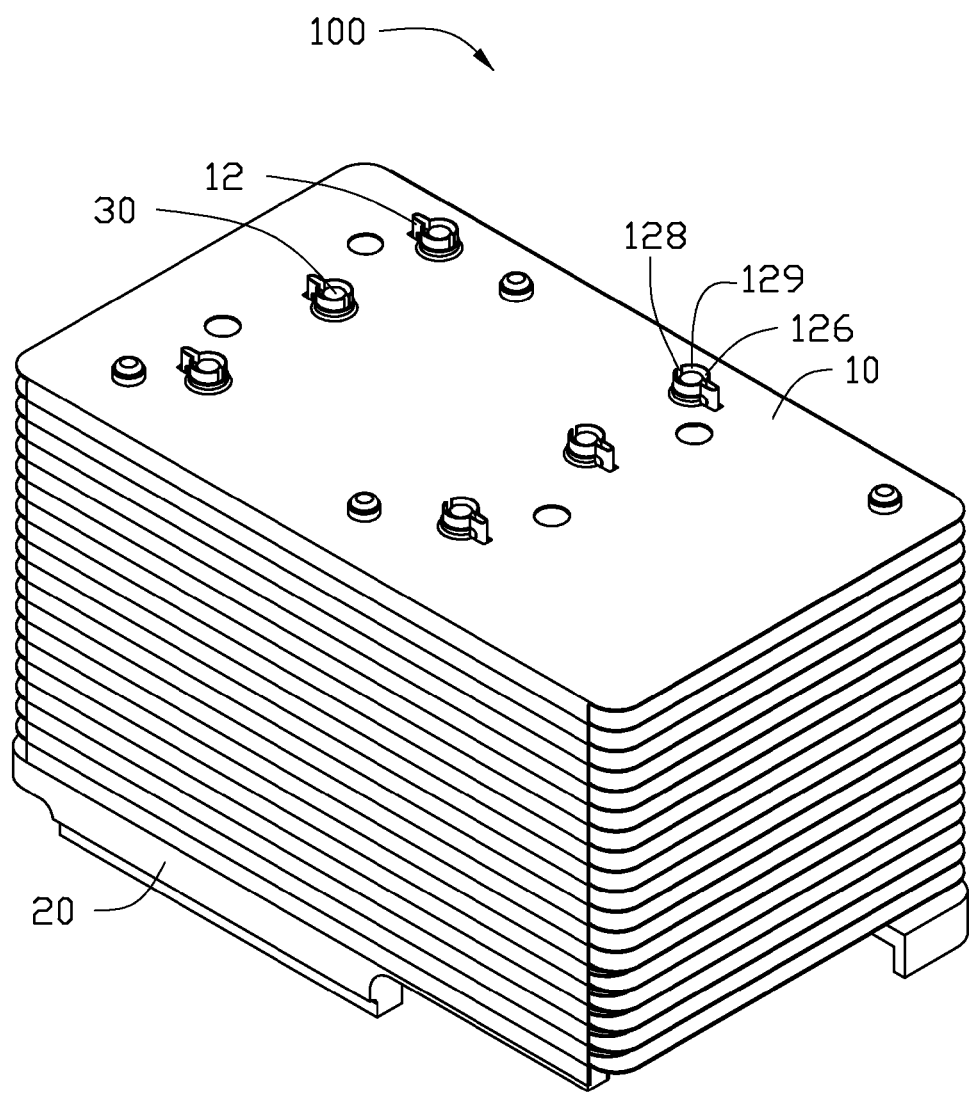
FIG. 1 is an isometric, assembled view of a heat dissipation device in accordance with an embodiment of the disclosure.
Figure 2:
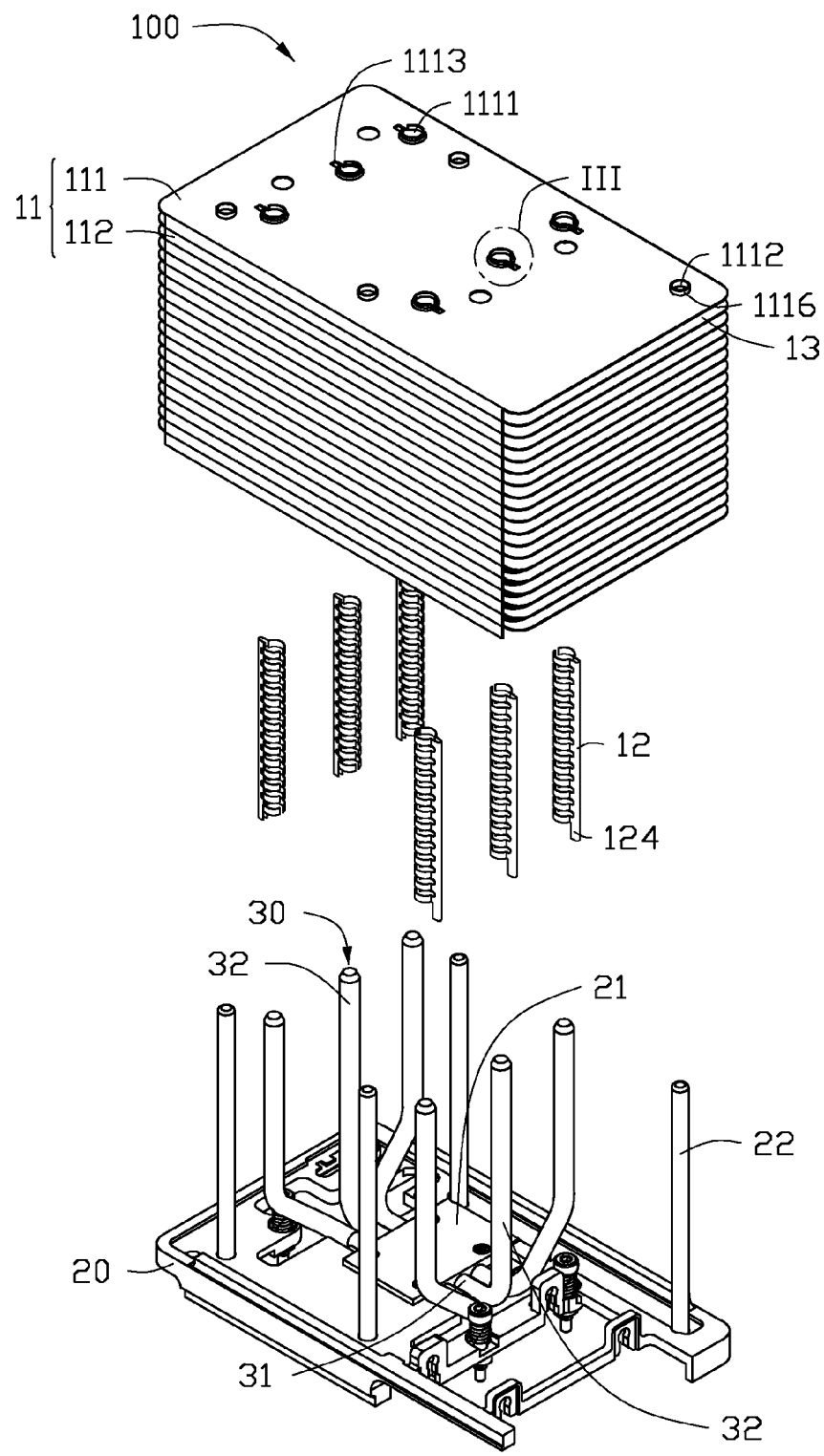
FIG. 2 is an exploded view of the heat dissipation device of FIG. 1.

Referring to FIGS. 1-2, a heat dissipation device 100 in accordance with an embodiment of the disclosure is illustrated. The heat dissipation device 100 comprises a fin assembly 10, a substrate 20 located below the fin assembly 10, and a plurality of heat pipes 30 thermally connecting the substrate 20 and the fin assembly 10.

The substrate 20 has a planar configuration. The substrate 20 comprises a heat absorbing plate 21 located at a middle portion thereof. The heat absorbing plate 21 is attached to an electronic component (not shown) for absorbing heat generated therefrom.

Each of the heat pipes 30 has a substantially U-shaped configuration, and comprises a heat absorption portion 31 and two heat dissipation portions 32 extending upwardly and outwardly from two opposite ends of the heat absorption portion 31. The heat absorption portions 31 of the heat pipes 30 are spaced from and parallel to each other. Each heat absorption portion 31 is coupled to the heat absorbing plate 21, with opposite ends thereof extending beyond the heat absorbing plate 21.

The fin assembly 10 comprises a plurality of fins 11 stacked vertically together, a plurality of protective members 12, and a plurality of electrically conductive posts 22. The fins 11 are spaced from and parallel to each other. The protective members 12 and electrically conductive posts 22 extend vertically through the fins 11 and contact the fins 11.

Each of the fins 11 comprises a rectangular main body 111, and two bent plates 112 depending from two opposite sides of the main body 111 towards the lower adjacent fin 11. A bottom end of each bent plate 112 abuts a substantially linear junction of the lower adjacent fin 11 where the bent plate 112 of the lower adjacent fin 11 bends down from the main body 111 of the lower adjacent fin 11. The two bent plates 112 of each fin 11 thereby provide an interval between each fin 11 and the lower adjacent fin 11, thus defining an air passage 13 between the two fins 11.

Figure 3:
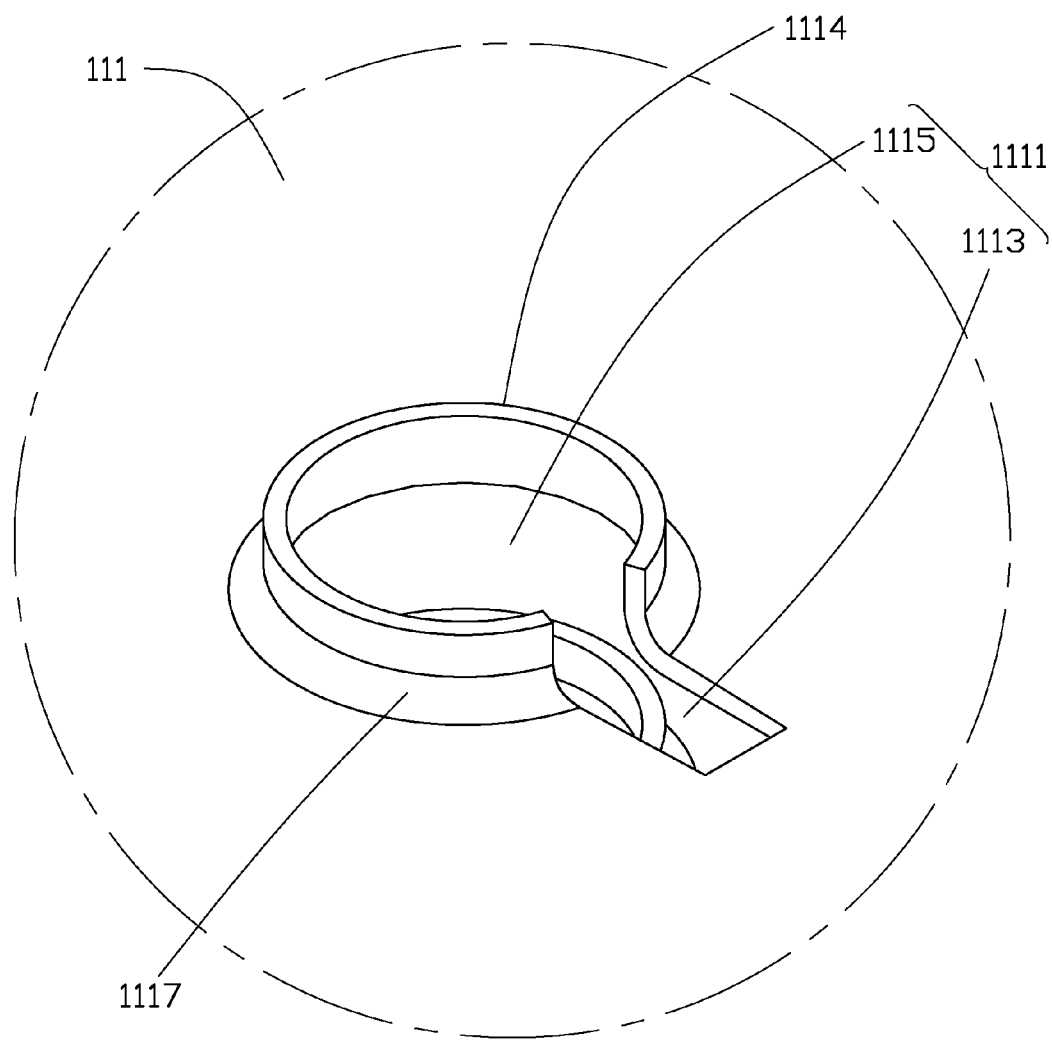
FIG. 3 is an enlarged view of a circled portion III of FIG. 2.

Referring also to FIG. 3, the main body 111 of each fin 11 defines a plurality of joining holes 1111, corresponding to the heat dissipation portions 32 of the heat pipes 30. The joining holes 1111 of each fin 11 are arranged in two rows, each row extending along a horizontal direction. The protective members 12 correspond to the joining holes 1111 of the fins 11 and are received therein. Each of the joining holes 1111 comprises a round extending hole 1115, and a substantially rectangular latching hole 1113 communicating with the extending hole 1115. The latching holes 1113 are located at outer sides of the two rows of extending holes 1115. The latching holes 1113 in one of the two rows are symmetrically opposite to the latching holes 1113 in the other one of the two rows. A first flange 1114 extends upwardly from the main body 111 of each fin 11 around each extending hole 1115, towards the upper adjacent fin 11. A curved connecting portion 1117 is formed at a root of the first flange 1114. The first flange 1114 is shorter than a distance between the two adjacent fins 11. The main body 111 of each fin 11 also defines a plurality of securing holes 1112 to receive the electrically conductive posts 22 therein. An annular second flange (or collar) 1116 extends perpendicularly upwardly from the main body 111 around a corresponding securing hole 1112, towards the upper adjacent fin 11. The second flange 1116 is for fixing to a circumference of a corresponding electrically conductive post 22.

The electrically conductive posts 22 are made of metal or metal alloy with a high heat conductivity coefficient, such as copper, copper-alloy, or other suitable material. The electrically conductive posts 22 are elongated and cylindrical. The electrically conductive posts 22 extend through and are received in the securing holes 1112 of the fins 11, respectively. Thus, the fins 11 are electrically connected by the electrically conductive posts 22, and easily attain a consistent and desired metal oxide film with a predetermined thickness over their surfaces during anodizing of the fin assembly 10.

Figure 4:
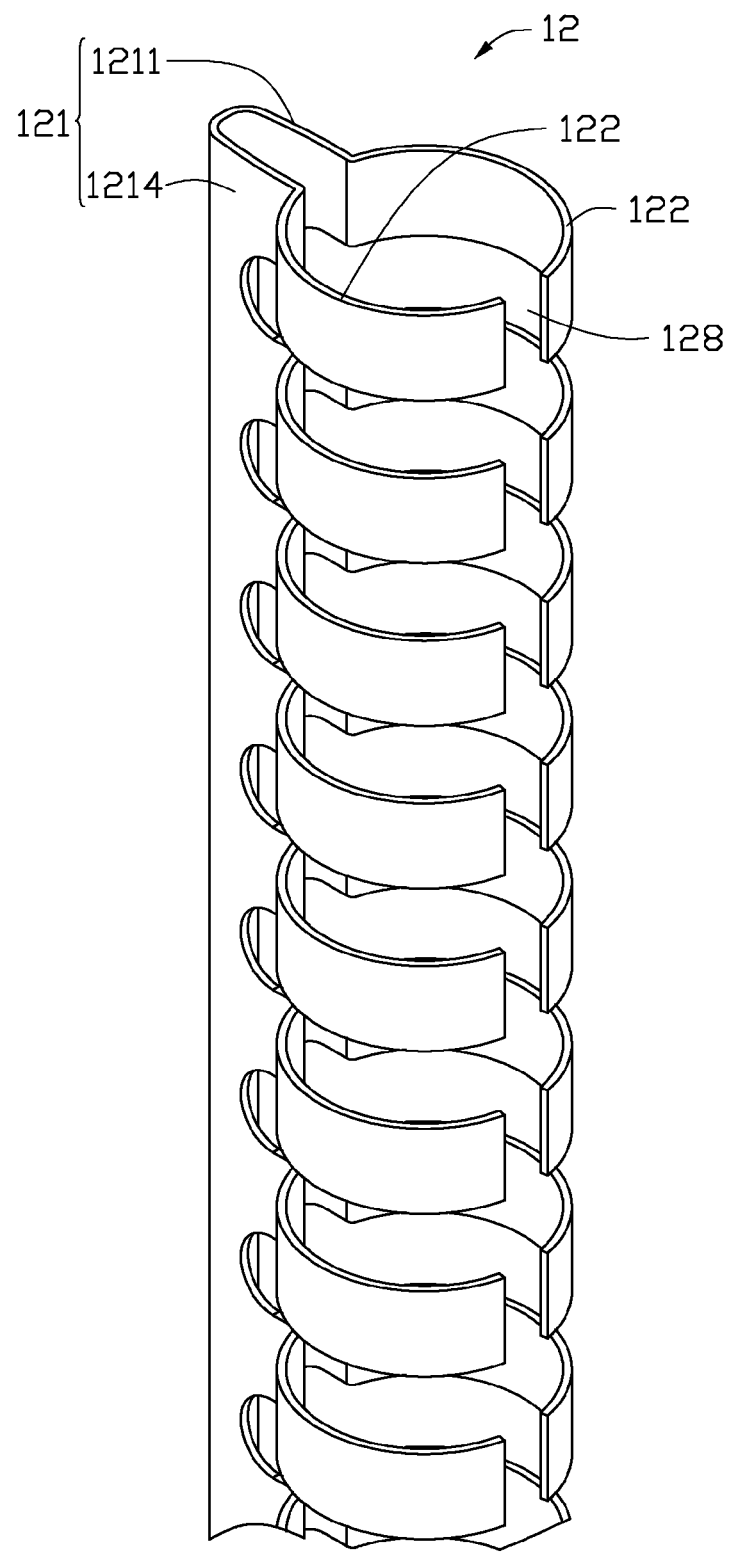
FIG. 4 is an enlarged view of part of a protective member of the heat dissipation device of FIG. 2.

Referring also to FIG. 4, each of the protective members 12 is integrally formed; i.e., as a single one-piece monolithic body of the one same material. Each protective member 12 has an elongated configuration and is elastically deformable. The protective member 12 comprises a latching portion 121, and multiple pairs of elastic arms 122 extending from the latching portion 121. The pairs of elastic arms 122 are evenly spaced from each other along a length (height) of the latching portion 121. The latching portion 121, having a substantially U-shaped cross section, comprises a first side plate 1211 and a second side plate 1214 substantially parallel to the first side plate 1211. Each pair of elastic arms 122 bends from free lateral sides of the first and second side plates 1211, 1214, respectively. The two elastic arms 122 are oriented symmetrically opposite each other, and cooperatively form a substantially annular configuration. The distal ends of each pair of elastic arms 122 are spaced from and face each other to define a cutout 128 therebetween. The annular configurations of multiple pairs of elastic arms 122 are parallel to and spaced from each other, thereby providing a distance between each two adjacent pairs of elastic arms 122. The distance between each two adjacent pairs of elastic arms 122 is identical to the height of each first flange 1114. A height of each elastic arm 122 is identical to a distance between the first flange 1114 of each fin 11 and the main body 111 of the upper adjacent fin 11. That is, the height of each elastic arm 122 plus the height of each first flange 1114 is equal to the distance between each two adjacent fins 11.

In this embodiment, the latching portion 121 of each protective member 12 has a bottom end thereof extending beyond the bottommost elastic arms 122, to act as a handle 124 by which the protective member 12 can be held during assembly.

During assembly of the heat dissipation device 100, the latching portions 121 of the protective members 12 vertically correspond to the latching holes 1113 of the bottommost fin 11, and the elastic arms 122 of the protective members 12 correspond to the extending holes 1115 of the bottommost fin 11. The latching portions 121 are compressed, contracting the annular configuration of each pair of elastic arms 122 inwardly so that the protective members 12 are easily received in the joining holes 1111 of the bottommost fin 11. Upward force applied on the protective members 12 sequentially extends the latching portions 121 through the latching holes 1113 of the upper fins 11. At the same time, the curved connecting portions 1117 guide the elastic arms 122 into the extending holes 1115. The latching portions 121 are compressed in the latching holes 1113 so that the latching portions 121 are received through the latching holes 1113.

Figure 5:
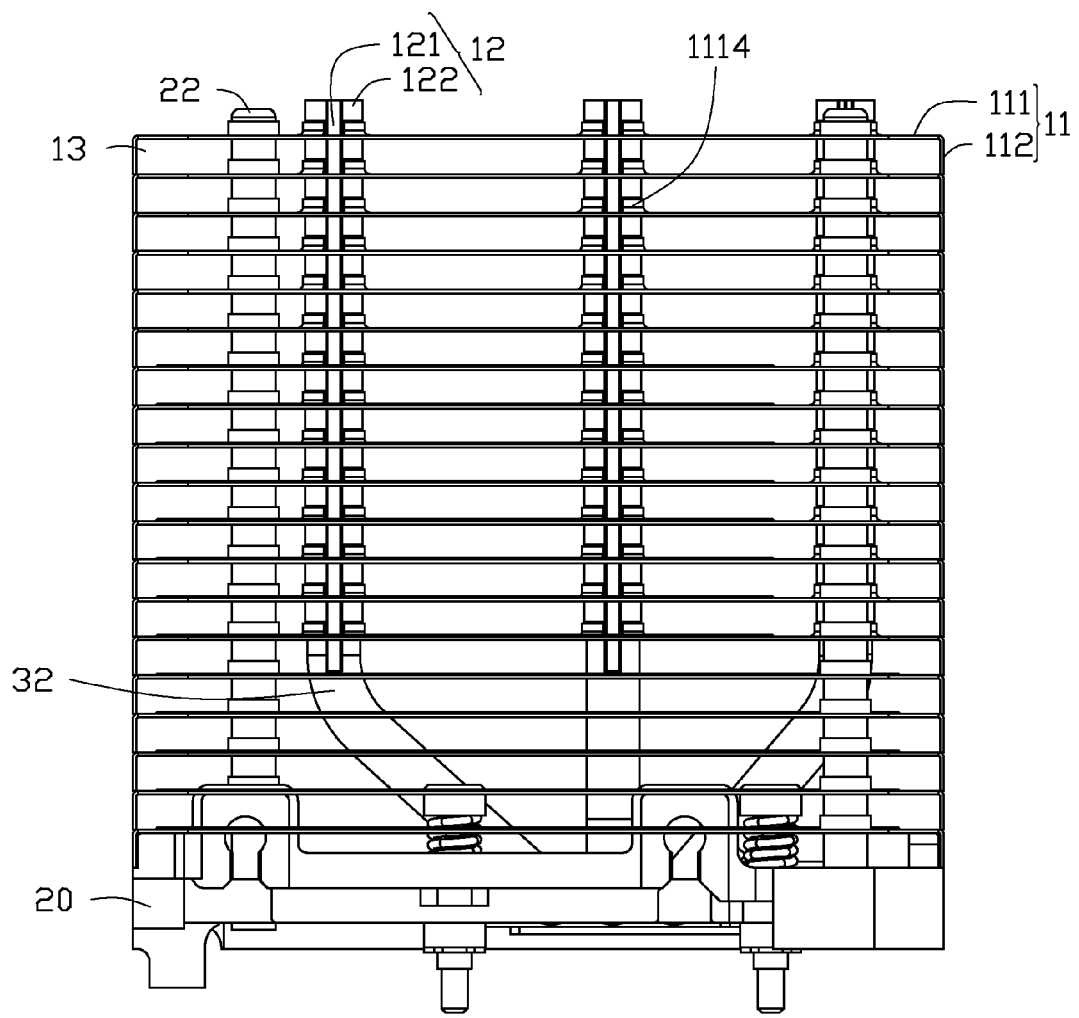
FIG. 5 is a front end plan view of the heat dissipation device of FIG. 1.

Referring also to FIG. 5, the protective members 12 are fully received in the joining holes 1111. Each elastic arm 122 is located between a top of the first flange 1114 of one fin 11 and the main body 111 of the upper adjacent fin 11. Each first flange 1114 is located between two adjacent pairs of elastic arms 122. Thus, the first flanges 1114 and the elastic arms 122 cooperatively define solder passages 126 (viewed in FIG. 1). Each solder passage 126 has an inner wall 129 formed by the first flanges 1114 and corresponding elastic arms 122. After solder is injected into the latching portions 121, the heat dissipation portions 32 of the heat pipes 30 are received in the solder passages 126. At the same time, the electrically conductive posts 22 are fixed on the substrate 20. During joining of the heat dissipation device 100, the solder is melted to flow into gaps between the inner walls 129 of the solder passages 126 and the heat dissipation portions 32. Therefore, the heat dissipation portions 32 are soldered with the inner walls 129 of the solder passages 126.

In this disclosure, the inner walls 129 of the solder passages 126 can prevent the solder from flowing into the air passages 13 of the fins 11. Furthermore, the protective members 12 are arranged in two rows. As seen in FIG. 1, the cutouts 128 of the protective members 12 are located at inner sides of the two rows of protective members 12. Therefore even if the solder overflows through the cutouts 128 into areas of the air passages 13 located between the two rows of protective members 12, when the heat dissipation device 100 is viewed side-on from a front end or a rear end thereof, the bent plates 112 can obscure any such overflown solder that would otherwise be visible. In other words, the bent plates 112 cover any aesthetically unappealing patches of overflown solder that exist between the two rows of protective members 12 after joining of the heat dissipation portions 32 to the fins 11.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a fin assembly comprising and a plurality of stacked fins, the fins spaced from each other to define a plurality of air passages therebetween, each fin having a joining hole defined therein; a heat pipe received in the joining holes of the fins; and a protective member comprising a latching portion and a plurality of pairs of elastic arms extending from the latching portion, each pair of elastic arms cooperatively arranged in a substantially annular configuration, each pair of elastic arms spaced from an adjacent pair of elastic arms, the latching member received in the joining holes of the fins, with the elastic arms located in the air passages of the fins, respectively, and abutting the heat pipe.

2. The heat dissipation device of claim 1, wherein the protective member is a single one-piece monolithic body of the same material, and is elastic.

3. The heat dissipation device of claim 1, wherein the protective member has an elongated configuration.

4. The heat dissipation device of claim 1, wherein the protective member further comprises a latching portion, the pairs of elastic arms extending from the latching portion and arranged along the latching portion in a row.

5. The heat dissipation device of claim 4, wherein the latching portion of the protective member has a U-shaped cross section, each pair of elastic arms extending from two free sides of the latching portion and being symmetrically opposite each other.

6. The heat dissipation device of claim 4, wherein the joining hole of each fin comprises an extending hole and a latching hole communicating with the extending hole, the latching hole allowing extension of the latching portion of the protective member therethrough, the extending hole allowing extension of the elastic arms therethrough.

7. The heat dissipation device of claim 6, wherein the latching portion of the protective member is compressed in the latching holes of the fins.

8. The heat dissipation device of claim 6, wherein each fin further comprises a main body and a flange extending from the main body around the extending hole, each pair of elastic arms located between the flange of a corresponding fin and the main body of a corresponding adjacent fin.

9. The heat dissipation device of claim 8, wherein a curved connecting portion is formed at a root of the flange for guiding the corresponding elastic arms into the extending hole.

10. The heat dissipation device of claim 8, wherein a height of each elastic arm plus a height of the flange of the corresponding fin is equal to a distance between the corresponding fin and the corresponding adjacent fin.

11. The heat dissipation device of claim 8, wherein the elastic arms and the flanges cooperatively define a solder passage comprising an inner wall, and the heat pipe abuts the inner wall.

12. The heat dissipation device of claim 11, wherein the heat pipe is soldered to the inner wall.

13. The heat dissipation device of claim 1, further comprising a substrate comprising a heat absorbing plate located at a middle portion thereof, the heat pipe comprising a heat absorption portion and a heat dissipation portion extending outwardly from an end of the heat absorption portion, the heat dissipation portion received in the joining holes of the fins and the heat absorption portion coupled in the heat absorbing plate.

14. A heat dissipation device comprising:
a fin assembly comprising a plurality of stacked fins and a plurality of air passages between the fins, each fin comprising a main body, an extending hole defined in the main body, and a flange extending from the main body around the extending hole; a heat pipe received in the extending holes of the fins and abutting the flanges of the fins; and a protective member comprising a latching portion which extends through the extending holes and a plurality of pairs of elastic arms extending from the latching portion, each pair of elastic arms sandwiched between a free end of the flange of a corresponding fin and the main body of a corresponding adjacent fin to prevent solder associated with the heat pipe from flowing into the corresponding air passage.

15. The heat dissipation device of claim 14, wherein a curved connecting portion is formed at a root of the flange of each fin for guiding the elastic arms into the extending holes.

16. The heat dissipation device of claim 14, wherein a height of each elastic arm plus a height of the flange of the corresponding fin is equal to a distance between the corresponding fin and the corresponding adjacent fin.

17. The heat dissipation device of claim 14, wherein the protective member further comprises a latching portion having a U-shaped cross section, each pair of elastic arms bending oppositely and respectively from two free sides of the latching portion to form a substantially annular configuration.

18. The heat dissipation device of claim 17, wherein each fin further comprises a latching hole communicating with the extending hole, in which the latching portion of the protective member is compressed.

19. The heat dissipation device of claim 14, wherein the protective member is a single one-piece monolithic body of the same material, and is elastic.

20. A heat dissipation device comprising:
a fin assembly comprising a plurality of stacked fins, the fins spaced from each other to define a plurality of air passages therebetween, each fin having a plurality of joining holes defined therein, the joining holes of the fins aligned with each other to provide a plurality of lines of joining holes of the fin assembly;
a heat pipe received in the joining holes of the fins; and
a plurality of protective members, each protective member comprising a latching portion and a plurality of pairs of elastic arms extending from the latching portion and arranged along a length of the latching portion, each pair of elastic arms cooperatively arranged in a substantially annular configuration with free ends of the pair of elastic arms pointing toward each other, each pair of elastic arms spaced from an adjacent pair of elastic arms, the latching portion received in a corresponding line of joining holes of the fin assembly, with the elastic arms located in the air passages of the fins, respectively, and abutting the heat pipe;
wherein the free ends of the pairs of elastic arms of one of the protective members are arranged in a line, the free ends of the pairs of elastic arms of another one of the protective members are arranged in a line, and the free ends of said one of the protective members face toward the free ends of said another one of the protective members.

* * * * *